United States Patent
Zhang et al.

(10) Patent No.: US 9,432,031 B2
(45) Date of Patent: Aug. 30, 2016

(54) PLL-VCO BASED INTEGRATED CIRCUIT AGING MONITOR

(71) Applicant: Ningbo University, Ningbo (CN)

(72) Inventors: Yuejun Zhang, Ningbo (CN); Pengjun Wang, Ningbo (CN); Zhidi Jiang, Ningbo (CN); Xuelong Zhang, Ningbo (CN)

(73) Assignee: NINGBO UNIVERSITY, Ningbo (CN)

( * ) Notice: Subject to any disclaimer, the term of this patent is extended or adjusted under 35 U.S.C. 154(b) by 0 days.

(21) Appl. No.: 14/842,863

(22) Filed: Sep. 2, 2015

(65) Prior Publication Data

US 2016/0087640 A1  Mar. 24, 2016

(30) Foreign Application Priority Data

Sep. 23, 2014 (CN) ............................ 2014 1 0487254

(51) Int. Cl.
*H03L 7/06* (2006.01)
*H03L 7/097* (2006.01)
*H03L 7/099* (2006.01)

(52) U.S. Cl.
CPC ............... *H03L 7/097* (2013.01); *H03L 7/099* (2013.01)

(58) Field of Classification Search
CPC ............................... H03L 7/097; H03L 7/099
USPC ........ 327/156–163, 147–150, 378, 379, 306, 327/307, 310, 317, 509, 538, 551; 375/373–376; 331/16, 18, 46–48
See application file for complete search history.

(56) References Cited

U.S. PATENT DOCUMENTS

| | | | | |
|---|---|---|---|---|
| 6,121,844 A | * | 9/2000 | Suzuki | H03L 7/0891 327/159 |
| 7,860,205 B1 | * | 12/2010 | Aweya | H03L 7/093 370/497 |
| 2006/0158263 A1 | * | 7/2006 | Goldberg | H03L 7/085 331/16 |
| 2007/0080752 A1 | * | 4/2007 | Smith | G01R 31/31709 331/16 |
| 2012/0146694 A1 | * | 6/2012 | Korniienko | G06F 1/10 327/158 |
| 2014/0097986 A1 | * | 4/2014 | Xue | H01Q 3/34 342/372 |

* cited by examiner

*Primary Examiner* — Lincoln Donovan
*Assistant Examiner* — Thomas Skibinski
(74) *Attorney, Agent, or Firm* — Matthias Scholl, PC; Matthias Scholl

(57) ABSTRACT

A PLL-VCO based integrated circuit aging monitor, including: a control circuit, a monitoring circuit, and an output circuit. The monitoring circuit includes a reference circuit, an aging generation circuit, and a comparison circuit. The reference circuit is a PLL circuit insensitive to a parameter error caused by the aging of circuit. The aging generation circuit is a VCO circuit sensitive to the parameter error. The control circuit is connected to the PLL circuit, the VCO circuit, the comparison circuit, and the output circuit. The output end of the PLL circuit is connected to a first input end of the comparison circuit, and the output end of the VCO circuit is connected to a second input end of the comparison circuit. The output end of the comparison circuit is connected to the input end of the output circuit. The input end of the PLL circuit inputs a reference clock signal.

6 Claims, 11 Drawing Sheets

US 9,432,031 B2

PLL-VCO BASED INTEGRATED CIRCUIT AGING MONITOR

CROSS-REFERENCE TO RELATED APPLICATIONS

Pursuant to 35 U.S.C. §119 and the Paris Convention Treaty, this application claims the foreign priority benefit of Chinese Patent Application No. 201410487254.0 filed Sep. 23, 2014, the contents of which, are incorporated herein by reference. Inquiries from the public to applicants or assignees concerning this document or the related applications should be directed to: Matthias Scholl P. C., Attn.: Dr. Matthias Scholl Esq., 245 First Street, 18$^{th}$ Floor, Cambridge, Mass. 02142.

BACKGROUND OF THE INVENTION

1. Field of the Invention

The invention relates to an integrated circuit aging monitor, and more particularly to a high-accuracy PLL-VCO based aging monitor circuit.

2. Description of the Related Art

As shown in FIG. 1, typical circuit aging is often described by a reaction-diffusion model. Traditional aging monitors fail to eliminate self-aging effect, thus resulting in inaccurate aging monitoring data.

SUMMARY OF THE INVENTION

In view of the above-described problems, it is one objective of the invention to provide a high-accuracy PLL-VCO based aging monitor circuit. The aging monitor employs a phase locking loop (PLL) circuit which is insensitive to parameter error caused by the aging of a circuit as a reference circuit, and a voltage controlled oscillator (VCO) circuit which is sensitive to parameter error caused by the aging of a circuit as an aging-causing circuit. Aging data is obtained by comparing the output signal of PLL circuit and VCO circuit, thus eliminating the harmful effects that the aging effects of the aging monitor itself has on the aging monitoring results, and improving the accuracy of aging monitoring data.

To achieve the above objective, in accordance with one embodiment of the invention, there is provided a high-accuracy PLL-VCO based aging monitor circuit, comprising: a control circuit, a monitoring circuit, and an output circuit, the monitoring circuit comprising: a reference circuit, an aging generation circuit and a comparison circuit. The reference circuit is the PLL circuit which is insensitive to parameter error caused by the aging of circuit. The aging generation circuit is the VCO circuit which is sensitive to parameter error caused by the aging of circuit. The control circuit is connected to the PLL circuit, the VCO circuit, the comparison circuit and the output circuit; an output end of the PLL circuit is connected to a first input end of the comparison circuit, and an output end of the VCO circuit is connected to a second input end of the comparison circuit, and an output end of the comparison circuit is connected to an input end of the output circuit; an input end of the PLL circuit inputs a reference clock signal.

The output end of the PLL circuit outputs a reference frequency signal, and the output end of the VCO circuit outputs a monitoring frequency signal; and when in use, the comparison circuit compares the reference frequency signal with the monitoring frequency signal to yield aging data and then outputs the aging data via an output end of the output circuit; an amplitude of the reference clock signal is the same as that of a clock frequency signal output by the VCO circuit in an initial state; a period of the clock frequency signal output by the VCO circuit in the initial state is denoted as T, and the period of the reference clock signal is T1, and T≤T1≤2T.

In a class of this embodiment, the VCO circuit comprises at least one VCO unit, and the at least one VCO unit comprises: a differential voltage oscillator, a first level shifter and a second level shifter having the same circuit structure, a duty cycle circuit, and a first frequency divider; a control end of the differential voltage oscillator is connected to a controller; a first output end of the differential voltage oscillator is connected to an input end of the first level shifter; a second output end of the differential voltage oscillator is connected to an input end of the second level shifter; an output end of the first level shifter is connected to a first input end of the duty cycle circuit; an output end of the second level shifter is connected to a second input end of the duty cycle circuit; an output end of the duty cycle circuit is connected to an input end of the first frequency divider; an output end of the first frequency divider is an output end of the VCO unit, and one output end of the VCO unit functions one output end of the VCO circuit.

In a class of this embodiment, the first level shifter and the second level shifter each comprise: a first PMOS transistor; a second PMOS transistor; a first NMOS transistor; a second NMOS transistor; and an inverter; sources of the first PMOS transistor and the second PMOS transistor both are connected to a power supply; a drain of first PMOS transistor, a drain of first NMOS transistor and a gate of the second PMOS transistor are connected together; a gate of the first PMOS transistor, a drain of second PMOS transistor and a drain of second NMOS transistor are connected together, and a connection end thereof is the output end of the level shifters; a gate of the first NMOS transistor is connected to an input end of the inverter, and a connection end thereof is the input end of the first and second level shifters; an output end of the inverter is connected to a gate of the second NMOS transistor; and sources of the first NMOS transistor and the second NMOS transistor are both grounded.

The duty cycle circuit comprises: a third PMOS transistor; a fourth PMOS transistor; a third NMOS transistor; and a fourth NMOS transistor; a gate of the third NMOS transistor is connected to a gate of the fourth PMOS transistor and a connection end thereof is the first output end of the duty cycle circuit; a gate of the fourth NMOS transistor is connected to a gate of the third PMOS transistor, and a connection end thereof is the second output end of the duty cycle circuit; a drain of third NMOS transistor and a source of the third PMOS transistor both connect to the power supply; a source of the third NMOS transistor, a drain of third PMOS transistor, a drain of fourth NMOS transistor and a source of the fourth PMOS transistor are connected together and a connection end thereof is the output end of the duty cycle circuit; a source of the fourth NMOS transistor and a drain of fourth PMOS transistor are both grounded.

The differential voltage oscillator comprises: a first NAND gate; a second NAND gate; and n cascaded differential delay cells which have the same circuit structures, and n is an odd number greater than 1. The differential delay cells each comprise: a fifth PMOS transistor, a sixth PMOS transistor, a fifth NMOS transistor and a sixth NMOS transistor; and sources of the fifth PMOS transistor and the sixth PMOS transistor both connect to the power supply; a drain of the fifth PMOS transistor and a gate of the sixth PMOS transistor and a drain of the fifth NMOS transistor are connected together and a connection end thereof is the second output end of the differential delay cells; a drain of the sixth PMOS transistor, a gate of the fifth PMOS transistor and a drain of the sixth NMOS transistor are connected together, and a connection end thereof is a first output end of the differential delay cells; sources of the fifth NMOS transistor and the sixth NMOS transistor are both grounded; a gate of the fifth NMOS transistor is a first input end of the differential delay cells, and a gate of the sixth NMOS transistor is a second input end of the differential delay cells.

A first input end of the first NAND gate is connected to a first input end of the second NAND gate, and a connection end thereof is the control end of the differential voltage oscillator; an output end of the first NAND gate is connected to a first input end of a 1st differential delay cell; an output end of the second NAND gate is connected to a second input end of the 1st differential delay cell; a first output end of a jth differential delay cell is connected to a first input end of a (j+1)th differential delay cell; a second output end of the jth differential delay cell is connected to a second input end of the (j+1)th differential delay cell, j=1, 2, 3, . . . , n−1; a first output end of a nth differential delay cell is connected to a second output end of the first NAND gate; a second output end of the nth differential delay cell is connected to a second input end of the second NAND gate, and a first output end of the nth differential delay cell is a first output end of the differential voltage oscillator; and a second output end of the nth differential delay cell is a second output end of the differential voltage oscillator.

In a class of this embodiment, the PLL circuit comprises: a third NAND gate; a phase frequency detector; a charge pump; a low-pass filter; a voltage controlled oscillator (VCO); and a second frequency divider; a first input end of the third NAND gate is the input end of the PLL circuit; a second input end of the third NAND gate is the control end of the PLL circuit and is connected to a controller; an output end of the third NAND gate is connected to a first input end of the phase frequency detector; an output end of the phase frequency detector is connected to an input end of the charge pump; an output end of the charge pump is connected to an input end of the low-pass filter; an output end of the low-pass filter is connected to the voltage control end of the VCO; an output end of the VCO is connected to the input end of the second frequency divider; an output end of the second frequency divider is connected to a second input end of the phase frequency detector, and an output end of the phase frequency detector is the output end of the PLL circuit.

In a class of this embodiment, the VCO comprises m cascaded voltage controlled oscillating units, and m is an odd number greater than 1. The voltage controlled oscillating units each comprise: a seventh PMOS transistor; an eighth PMOS transistor; a seventh NMOS transistor; and an eighth NMOS transistor; a source of the seventh PMOS transistor is connected to a source of the eighth PMOS transistor, and a connection end thereof is the voltage control end of the voltage controlled oscillating units; a gate of the seventh NMOS transistor is a first input end of the voltage controlled oscillating units, and a gate of the eighth NMOS transistor is a second input end of the voltage controlled oscillating units; a drain of seventh PMOS transistor, a gate of the eighth PMOS transistor and a drain of seventh NMOS transistor are connected together, and a connection end thereof is a second output end of the voltage controlled oscillating units; a drain of eighth PMOS transistor, a gate of the seventh PMOS transistor and a drain of eighth NMOS transistor are connected together, and a connection end thereof is a first output end of the voltage controlled oscillating units; sources of the seventh NMOS transistor and the eighth NMOS transistor are both grounded; a first output end of a kth voltage controlled oscillating unit is connected to a first input end of a (k+1)th voltage controlled oscillating unit; a second output end of the kth voltage controlled oscillating unit is connected to a second input end of the (k+1)th voltage controlled oscillating unit, and k=1, 2, 3, . . . , m−1; a first output end of an mth voltage controlled oscillating unit is connected to a first input end of a 1st voltage controlled oscillating unit; a second output end of the mth voltage controlled oscillating unit is connected to a second input end of the 1st voltage controlled oscillating unit; a first output end of the mth voltage controlled oscillating unit is the output end of the VCO. The voltage control end of the mth voltage controlled oscillating unit is in connection, and a connection end thereof is the voltage control end of the VCO.

In a class of this embodiment, the comparison circuit comprises: a phase comparator; and a counter; and the output circuit is a shift register. The output end of the PLL circuit is connected to a first input end of the phase comparator and a first input end of the counter; a second output end of the phase comparator is connected to the output end of the VCO circuit; an output end of the phase comparator is connected to a second output end of the counter; a control end of the counter is connected to a control circuit; an output end of the counter is connected to an input end of the shift register; and an output end of the shift register outputs the aging data.

Compared with the existing technologies, advantages of PLL-VCO based aging monitor circuit of the invention are given below. The PLL circuit which is insensitive to parameter error caused by the aging of circuit is adopted as the reference circuit; the VCO circuit which is sensitive to parameter error caused by the aging of circuit is employed as the aging generation circuit. The clock signal, with the amplitude is the same as the amplitude of the clock frequency signal output by the VCO circuit in the initial state, and with period greater than or equal to the period of the clock frequency signal output by the VCO circuit in the initial state but less than or equal to the two times of the period of the clock frequency signal output by the VCO circuit in the initial state, is employed as the reference clock signal. The VCO circuit is arranged on the circuit with the aging state waiting to be tested; the reference clock signal is input into the PLL circuit; the PLL circuit outputs reference frequency signal, and VCO circuit outputs real-time monitoring frequency signal, thus aging data is obtained by comparing the monitoring frequency signal and the reference frequency signal. The reference frequency signal output by PLL circuit is only influenced by the outer reference clock signal, thus eliminating the harmful effects that the aging effects of the aging monitor circuit itself has on the aging monitoring results, and improving the accuracy of aging monitoring data. In addition, as the VCO circuit employs a differential structure, largely decreasing the interference caused by external noise to the aging monitoring circuit, and improving accuracy. When a plurality of monitoring points exist, monitoring multiple positions can be achieved by only increasing the number the VCO circuit, and shared PLL circuits largely decrease the hardware cost of circuits.

DETAILED DESCRIPTION OF THE EMBODIMENTS

For further illustrating the invention, experiments detailing a high-accuracy PLL-VCO based aging monitor circuit are described below. It should be noted that the following examples are intended to describe and not to limit the invention.

Figure 1:
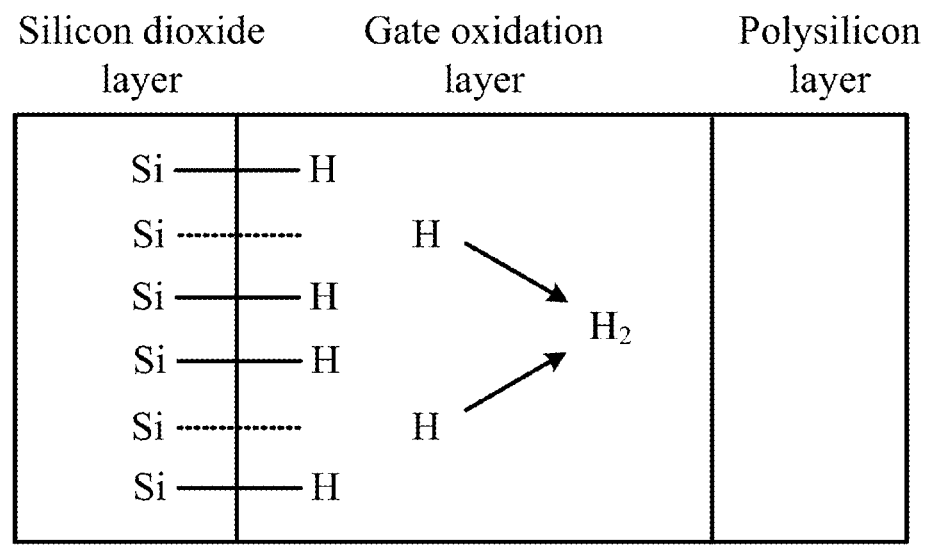
FIG. 1 is a reaction-diffusion model diagram of circuit aging effect in the prior art.
Figure 2:
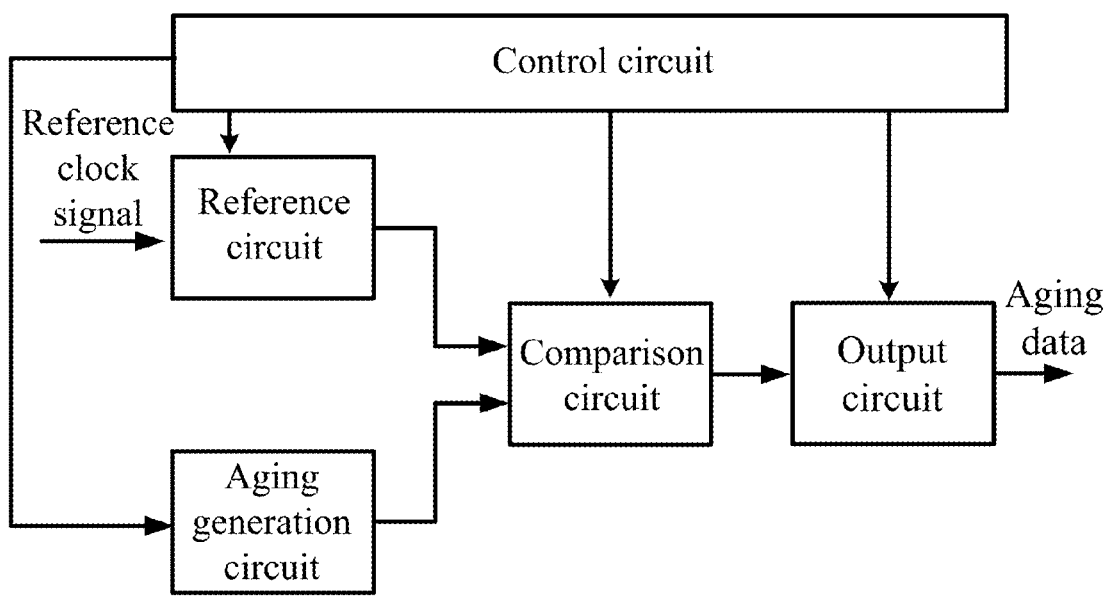
FIG. 2 is a first principle block diagram of a high-accuracy PLL-VCO based aging monitor circuit in accordance with one exemplary embodiment of the invention.
Figure 3:
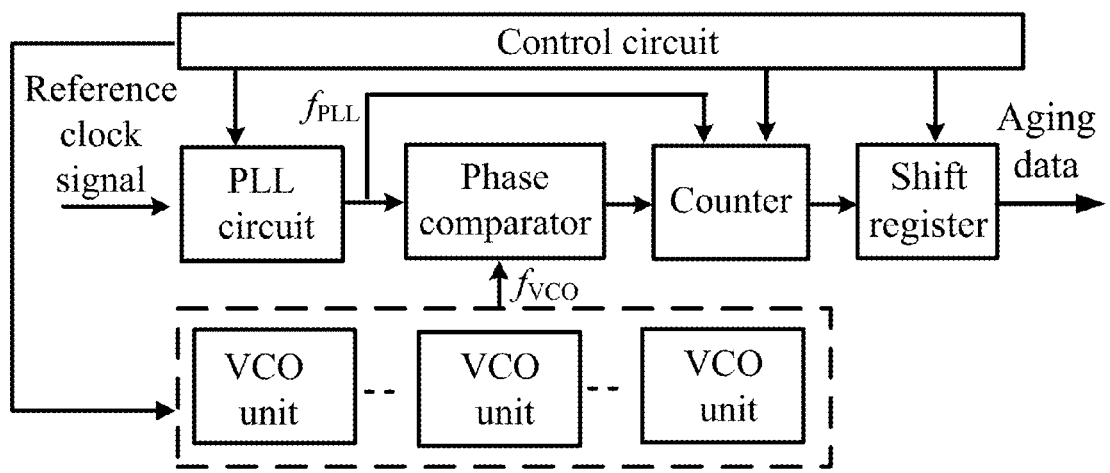
FIG. 3 is a second principle block diagram of a high-accuracy PLL-VCO based aging monitor circuit in accordance with one exemplary embodiment of the invention.

As shown in FIGS. 2-3, a high-accuracy PLL-VCO based aging monitor circuit comprises: a control circuit, a monitoring circuit, and an output circuit. The monitoring circuit comprises a reference circuit, an aging generation circuit, and a comparison circuit. The reference circuit is a phase locking loop circuit (PLL circuit) which is insensitive to parameter error caused by the aging of circuit. The aging generation circuit is a voltage controlled oscillator circuit (VCO circuit) which is sensitive to parameter error caused by the aging of circuit. The control circuit is connected to the PLL circuit, the VCO circuit, the comparison circuit, and the output circuit. An output end of the PLL circuit is connected to a first input end of the comparison circuit, and an output end of the VCO circuit is connected to a second input end of the comparison circuit, and an output end of the comparison circuit is connected to an input end of the output circuit. An input end of the PLL circuit inputs a reference clock signal. The output end of the PLL circuit outputs a reference frequency signal, and the output end of the VCO circuit outputs a monitoring frequency signal. The comparison circuit compares the reference frequency signal with the monitoring frequency signal to yield the aging data and then outputs the aging data via the output end of the output circuit. The amplitude of the reference clock signal is the same as the amplitude of the clock frequency signal output by the VCO circuit in the initial state. The period of the clock frequency signal output by the VCO circuit in the initial state is denoted as T, and the period of the reference clock signal is T1, and $T \leq T1 \leq 2T$.

Figure 4:
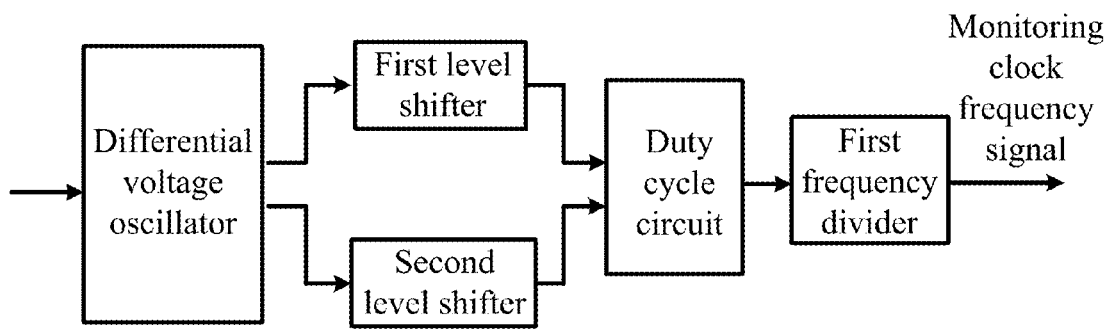
FIG. 4 is a principle block diagram of a VCO unit of a high-accuracy PLL-VCO based aging monitor circuit in accordance with one exemplary embodiment of the invention.

As shown in FIG. 4, the VCO circuit comprises at least one VCO unit, and the at least one VCO unit comprises: a differential voltage oscillator, two level shifters, a duty cycle circuit and a first frequency divider. The two level shifters have the same circuit structure, which are a first level shifter and a second level shifter. A control end of the differential voltage oscillator is connected to a controller; a first output end of the differential voltage oscillator is connected to an input end of the first level shifter; a second output end of the differential voltage oscillator is connected to an input end of the second level shifter. The output end of the first level shifter is connected to the first input end of the duty cycle circuit; an output end of the second level shifter is connected to a second input end of the duty cycle circuit; an output end of the duty cycle circuit is connected to an input end of the first frequency divider; an output end of the first frequency divider is an output end of the VCO unit, and one output end of the VCO unit is one output end of the VCO circuit.

Figure 5:
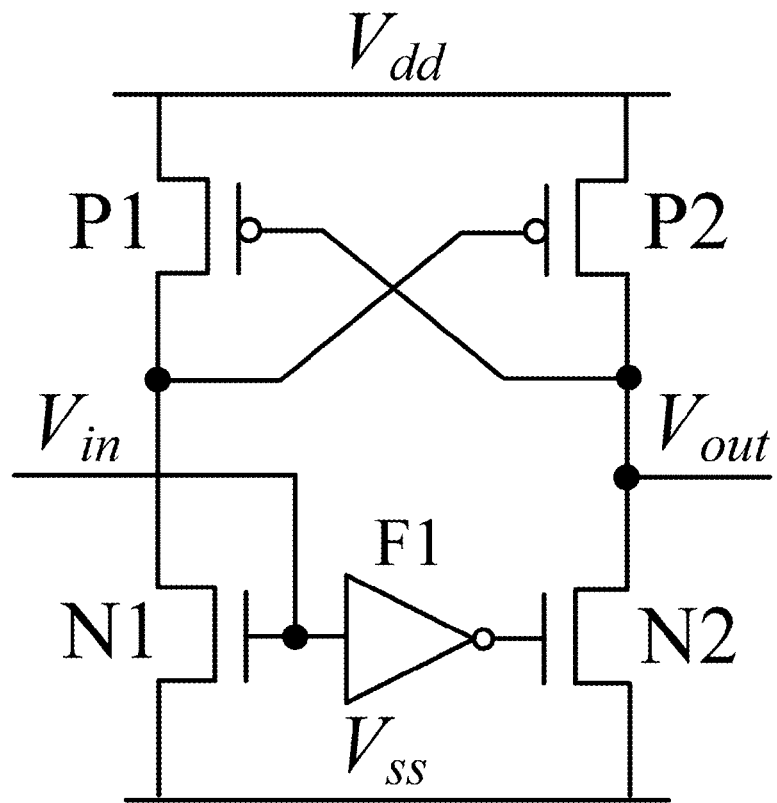
FIG. 5 is a circuit diagram of a first and a second level shifters in a VCO unit of a high-accuracy PLL-VCO based aging monitor circuit in accordance with one exemplary embodiment of the invention.
Figure 6:
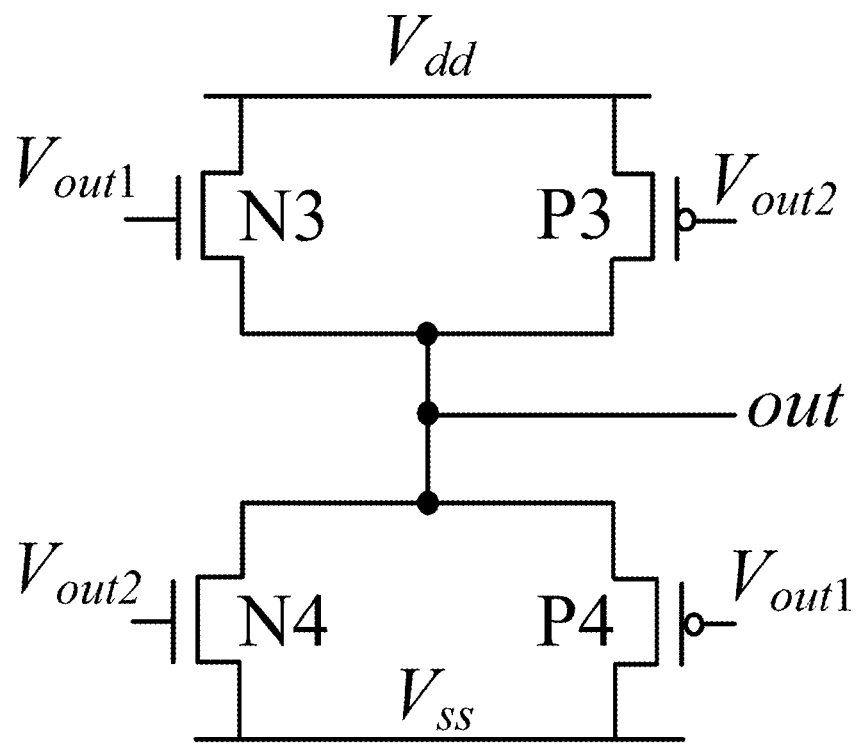
FIG. 6 is a circuit diagram of a duty cycle circuit in the VCO unit of a high-accuracy PLL-VCO based aging monitor circuit in accordance to one embodiment of the invention.

As shown in FIG. 5, the level shifters comprise: a first PMOS transistor P1, a second PMOS transistor P2, a first NMOS transistor N1, a second NMOS transistor N2 and an inverter F1. Sources of the first PMOS transistor P1 and the second PMOS transistor P2 both connect to the power supply. A drain of first PMOS transistor P1, a drain of first NMOS transistor N1 and a gate of the second PMOS transistor P2 are connected together. A gate of the first PMOS transistor P1, a drain of second PMOS transistor P2 and a drain of second NMOS transistor N2 are connected together, and a connection end thereof is the output end of the level shifters. A gate of the first NMOS transistor N1 is connected to an input end of the inverter F1, and a connection end thereof is the input end of the level shifters. An output end of the inverter F1 is connected to a gate of the second NMOS transistor N2. Sources of the first NMOS transistor N1 and the second NMOS transistor N2 are both grounded.

Figure 7:
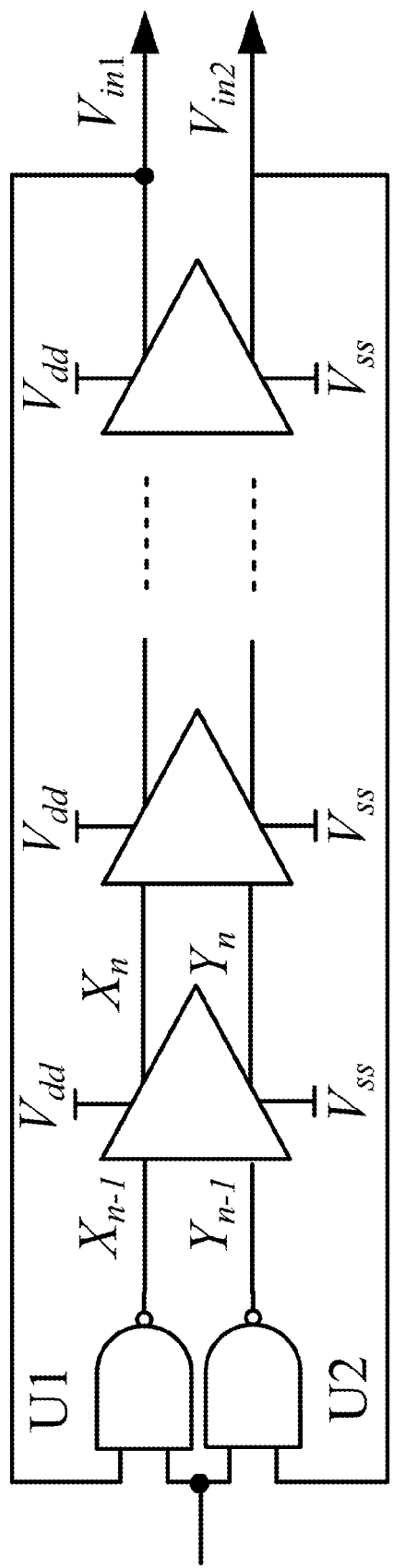
FIG. 7 is a circuit diagram of a differential voltage oscillator in a VCO unit of a high-accuracy PLL-VCO based aging monitor circuit in accordance with one exemplary embodiment of the invention.
Figure 8:
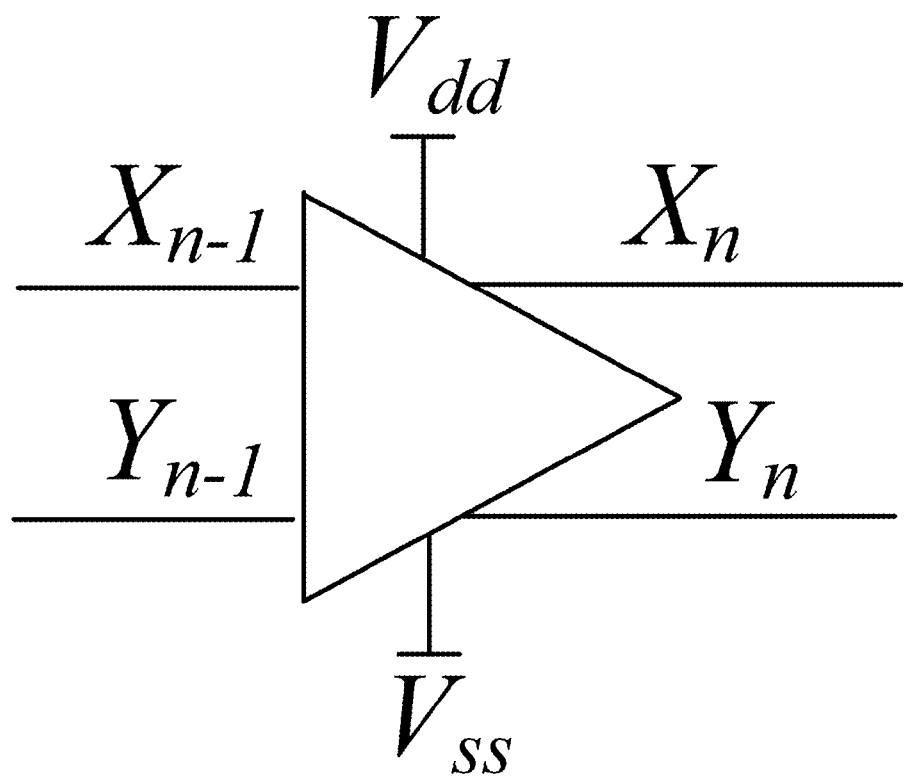
FIG. 8 is a graphical diagram of a differential delay cell of a differential voltage oscillator in a VCO unit of a high-accuracy PLL-VCO based aging monitor circuit in accordance with one exemplary embodiment of the invention.
Figure 9:
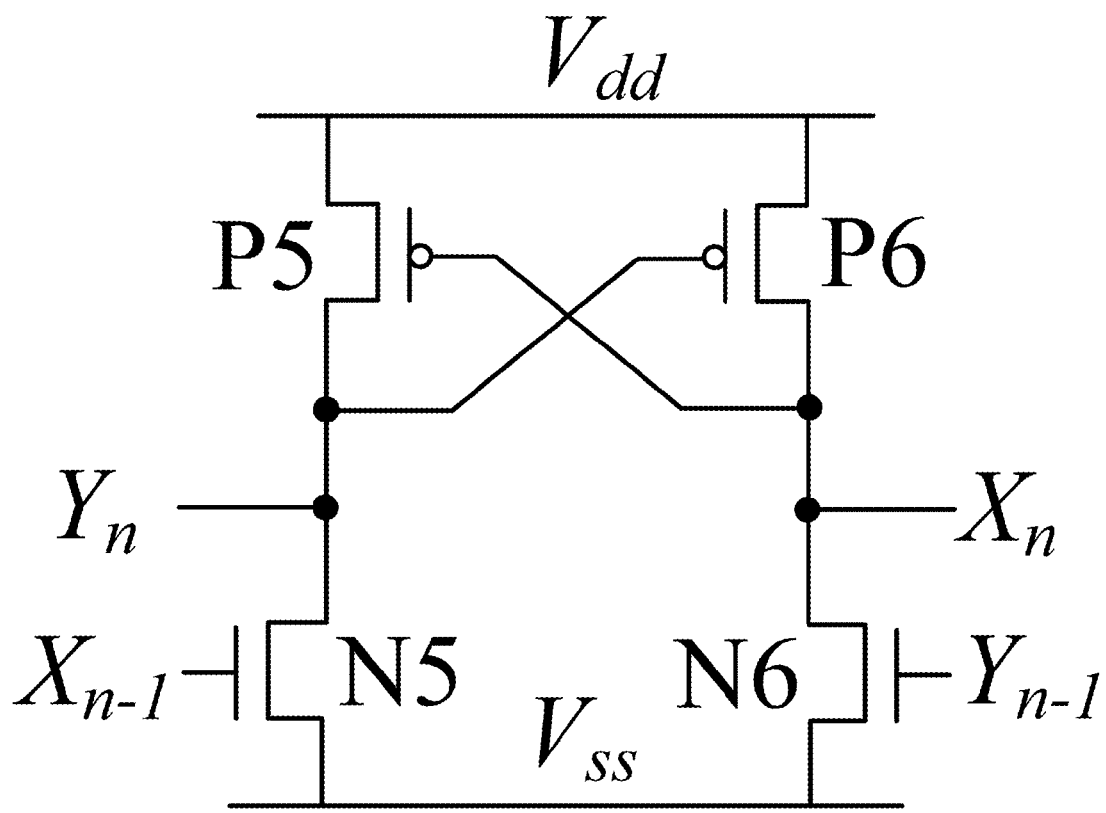
FIG. 9 is a circuit diagram of a differential delay cell of a differential voltage oscillator in a VCO unit of a high-accuracy PLL-VCO based aging monitor circuit.

As shown in FIGS. 7-9, a differential voltage oscillator comprises: a first NAND gate U1, a second NAND gate U2, and n cascaded differential delay cells which have the same circuit structures, and n is an odd number greater than 1. The differential delay cells comprises: a fifth PMOS transistor P5, a sixth PMOS transistor P6, a fifth NMOS transistor N5 and a sixth NMOS transistor N6. Sources of the fifth PMOS transistor P5 and the sixth PMOS transistor P6 both connect to the power supply. A drain of the fifth PMOS transistor P5 and a gate of the sixth PMOS transistor P6 and a drain of the fifth NMOS transistor N5 are connected together and a connection end thereof is a second output end of the differential delay cells. A drain of the sixth PMOS transistor P6, a gate of the fifth PMOS transistor P5 and a drain of the sixth NMOS transistor N6 are connected together, and a connection end thereof is a first output end of the differential delay cells. Sources of the fifth NMOS transistor N5 and the sixth NMOS transistor N6 are both grounded. A gate of the fifth NMOS transistor N5 is a first input end of the differential delay cells, and the gate of the sixth NMOS transistor N6 is a second input end of the differential delay cells. A first input end of the first NAND gate U1 is connected to a first input end of the second NAND gate U2, and a connection end thereof is the control end of the differential voltage oscillator. The output end of the first NAND gate U1 is connected to a first input end of the 1st differential delay cell. The output end of the second NAND gate U2 is connected to a second input end of the 1st differential delay cell. A first output end of the jth differential delay cell is connected to a first input end of the (j+1)th differential delay cell. A second output end of the jth differential delay cell is connected to a second input end of the (j+1)th differential delay cell, j=1, 2, 3, . . . , n−1. A first output end of the nth differential delay cell is connected to a second output end of the first NAND gate U1. A second output end of the nth differential delay cell is connected to a second input end of the second NAND gate U2, and a first output end of the nth differential delay cell is a first output end of the differential voltage oscillator. A second output end of the nth differential delay cell is a second output end of the differential voltage oscillator.

Figure 10:
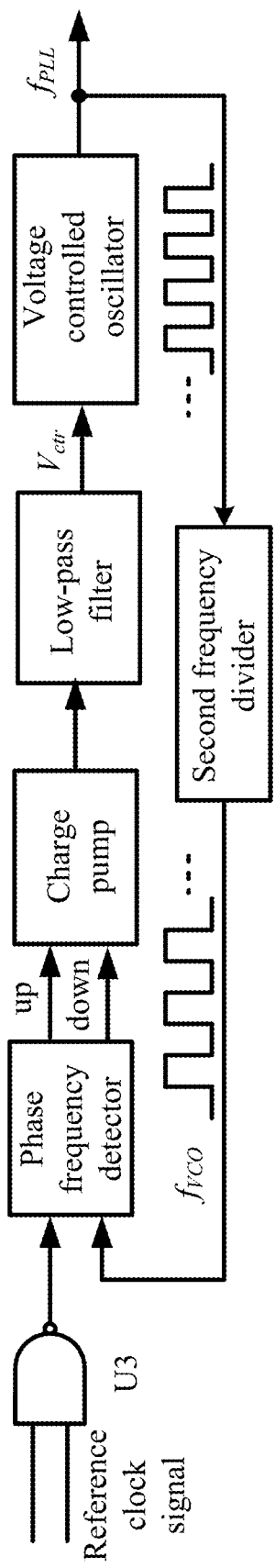
FIG. 10 is a principle block diagram of a PLL circuit of a high-accuracy PLL-VCO based aging monitor circuit in accordance with one exemplary embodiment of the invention.

As shown in FIG. 10, the PLL circuit comprises: a third NAND gate U3, a phase frequency detector, a charge pump, a low-pass filter, a voltage controlled oscillator (VCO), and a second frequency divider. A first input end of the third NAND gate U3 is the input end of the PLL circuit. A second input end of the third NAND gate U3 is the control end of the PLL circuit and connects the controller. An output end of the third NAND gate U3 is connected to a first input end of the phase frequency detector. An output end of the phase frequency detector is connected to an input end of the charge pump. An output end of the charge pump is connected to an input end of the low-pass filter. An output end of the low-pass filter is connected to the voltage control end of the VCO. An output end of the VCO is connected to the input end of the second frequency divider. An output end of the second frequency divider is connected to a second input end of the phase frequency detector, and an output end of the phase frequency detector is the output end of the PLL circuit.

Figure 11:
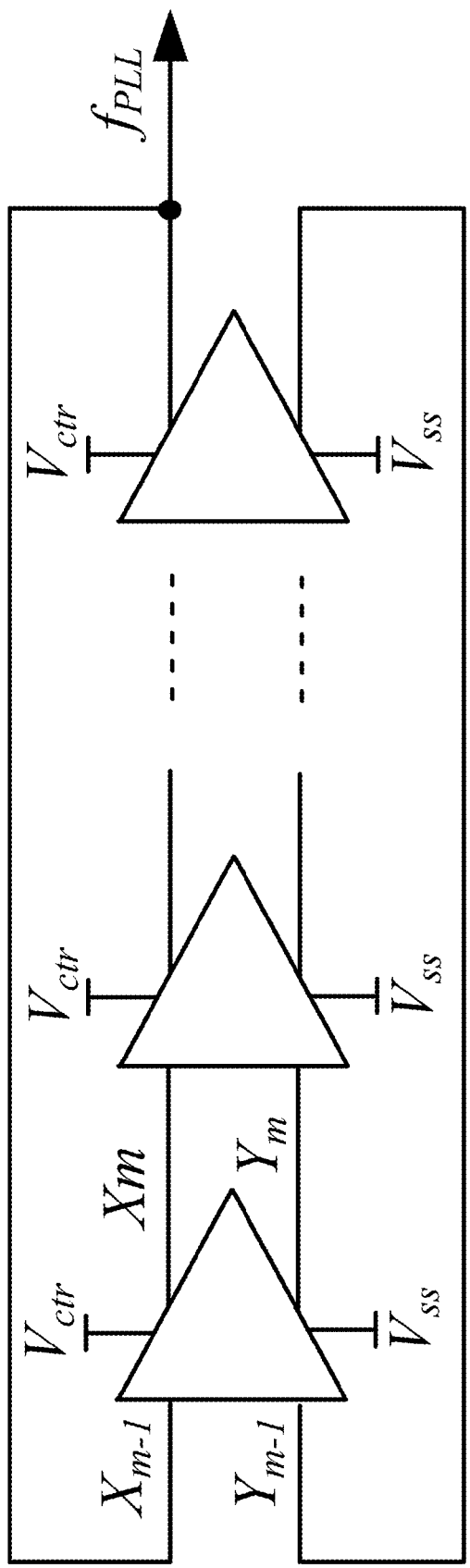
FIG. 11 is a circuit diagram of a voltage controlled oscillator (VCO) in a PLL circuit of a high-accuracy PLL-VCO based aging monitor circuit in accordance with one exemplary embodiment of the invention.
Figure 12:
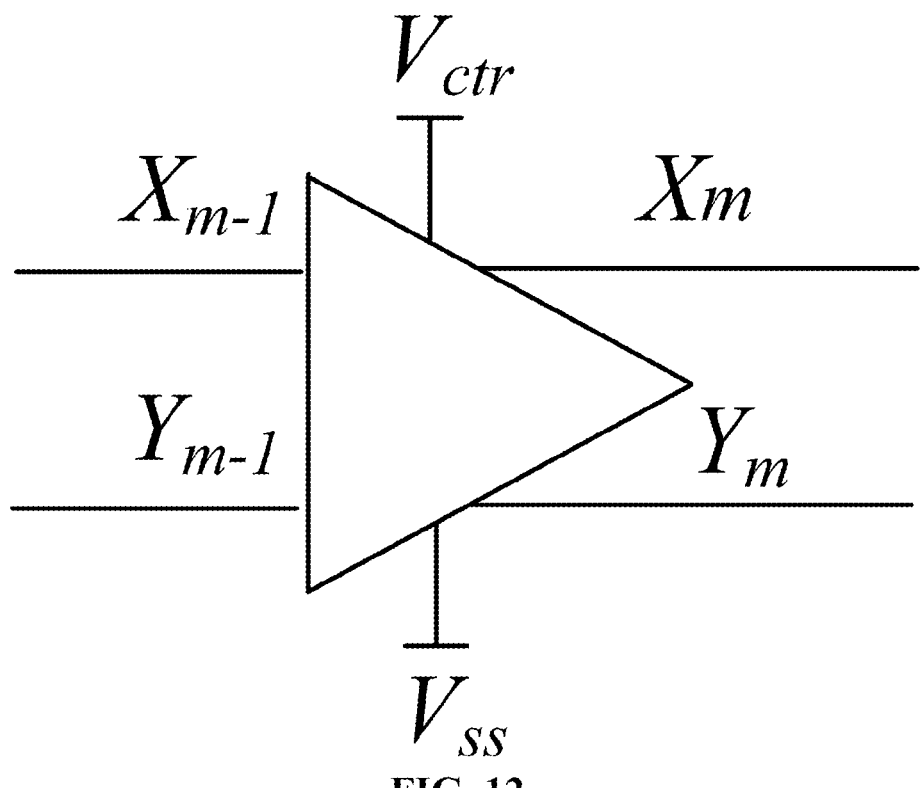
FIG. 12 is a graphical diagram of a VCO unit of a VCO in a PLL circuit of a high-accuracy PLL-VCO based aging monitor circuit in accordance with one exemplary embodiment of the invention.
Figure 13:
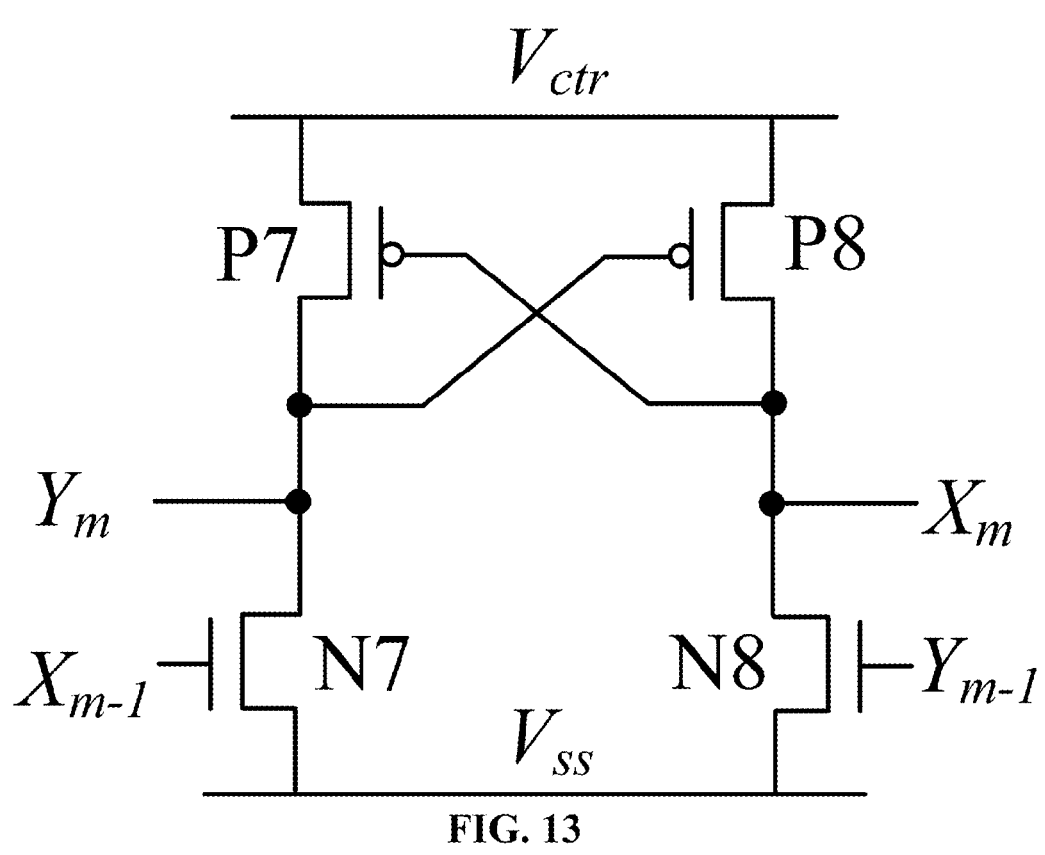
FIG. 13 is a circuit diagram of a VCO unit of a VCO in the PLL circuit of a high-accuracy PLL-VCO based aging monitor circuit in accordance with one exemplary embodiment of the invention.

As shown in FIGS. 11-13, the VCO comprises m cascaded voltage controlled oscillating units, and m is an odd number greater than 1.

The voltage controlled oscillating units each comprise: a seventh PMOS transistor P7, an eighth PMOS transistor P8, a seventh NMOS transistor N7 and an eighth NMOS transistor N8. The source of the seventh PMOS transistor P7 is connected to the source of the eighth PMOS transistor P8, and a connection end thereof is the voltage control end of the voltage controlled oscillating units. A gate of the seventh NMOS transistor N7 is a first input end of the voltage controlled oscillating units, and a gate of the eighth NMOS transistor N8 is a second input end of the voltage controlled oscillating units. A drain of seventh PMOS transistor P7, a gate of the eighth PMOS transistor P8 and a drain of seventh NMOS transistor N7 are connected together, and a connection end thereof is a second output end of the voltage controlled oscillating units. The drain of eighth PMOS transistor P8, the gate of the seventh PMOS transistor P7 and the drain of eighth NMOS transistor N8 are connected together, and a connection end thereof is a first output end of the voltage controlled oscillating units. Sources of the seventh NMOS transistor N7 and the eighth NMOS transistor N8 are both grounded.

A first output end of the kth voltage controlled oscillating unit is connected to a first input end of the (k+1)th voltage controlled oscillating unit. A second output end of the kth voltage controlled oscillating unit is connected to a second input end of the (k+1)th voltage controlled oscillating unit, and k=1, 2, 3, . . . , m−1. A first output end of the mth voltage controlled oscillating unit is connected to a first input end of the 1st voltage controlled oscillating unit. A second output end of the mth voltage controlled oscillating unit is connected to a second input end of the 1st voltage controlled oscillating unit. A first output end of the mth voltage controlled oscillating unit is the output end of the VCO. The voltage control end of the mth voltage controlled oscillating unit is in connection, and a connection end thereof is the voltage control end of the VCO.

The comparison circuit comprises: a phase comparator and a counter. The output circuit is a shift register. The output end of the PLL circuit is connected to a first input end of the phase comparator and a first input end of the counter. A second output end of the phase comparator is connected to the output end of the VCO circuit. An output end of the phase comparator is connected to a second output end of the counter.

The control end of the counter is connected to the control circuit. An output end of the counter is connected to an input end of the shift register. An output end of the shift register outputs the aging data.

The range of T1 is set to guarantee monitoring accuracy, and to avoid that the period of the PLL circuit and the VCO circuit vary too much, resulting in output data being too big, exceeding the maximal range of the counter, and leading to data overflow.

The control circuit, the phase comparator, the counter, the shift register, the phase frequency detector, the charge pump, the low-pass, the first frequency divider and the second frequency divider all employ mature products in the technical field thereof. The control circuit produces a plurality of control signals to control the reference circuit, the aging generation circuit, the comparison circuit and the output circuit.

As the reference frequency signals output by PLL circuit is insensitive to parameter deviation caused by circuit aging, the reference frequency signal is decided by reference clock signal, and can be employed as a reference variable of the high-accuracy PLL-VCO based aging monitor circuit. By comparing and quantifying the reference frequency signal with the monitoring frequency signal output by VCO circuit which is sensitive to aging circuit, aging degree of a circuit is obtained. Designing a PLL circuit to stabilize clock is the key of the PLL-VCO based aging monitor circuit. The PLL circuit in accordance with this embodiment comprises the phase frequency detector, the charge pump, the low-pass, the frequency divider and a plurality of VCO units (or differential delay cells), ensuring that the output end of VCO outputs rectangular-wave reference frequency signal.

Figure 14:
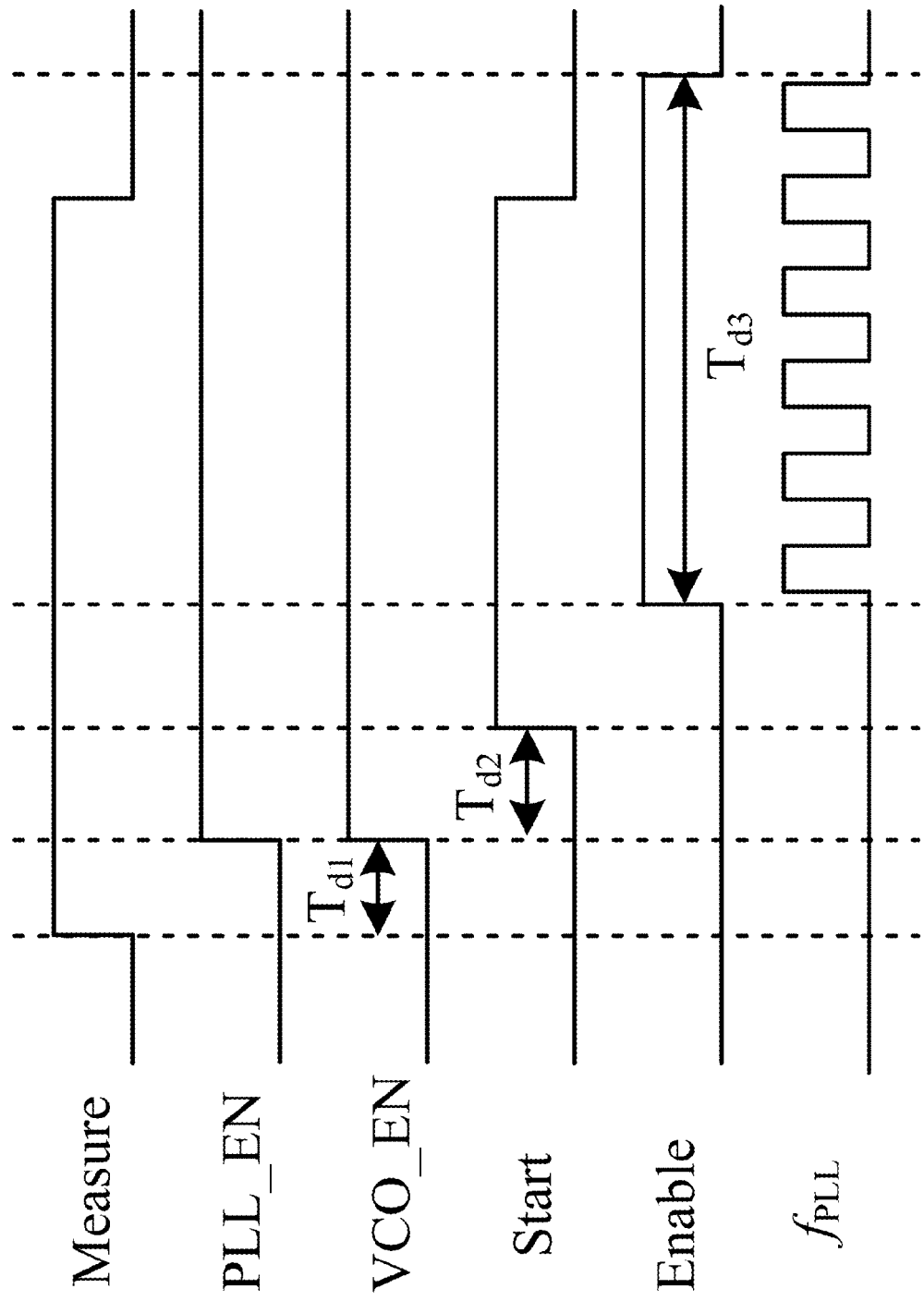
FIG. 14 is a sequence diagram of a high-accuracy PLL-VCO based aging monitor circuit in a measurement mode.

As the existence of phase comparator, a high-accuracy PLL-VCO based aging monitor circuit has a simple structure. When a controller receives an order, and then produces a control signal PLL-EN of PLL circuit and a control signal VCO-EN of VCO circuit, the PLL circuit and the VCO circuit are triggered into working condition, and at the moment the phase comparator produces a control pulse signal Enable. Breath of the pulse signal Enable is decided by frequency difference between the reference frequency signal output by PLL circuit and the monitoring frequency signal output by VCO circuit. When the pulse signal Enable is at the high level, the counter starts to count the reference frequency signal output by PLL circuit. When a circuit is aging, the breadth of the pulse signal Enable tends to change, causing data outputs by counter to change. FIG. 14 is a sequence diagram of the high-accuracy PLL-VCO based aging monitor circuit in measurement mode, $T_{d1}$ is the time from the beginning of the measurement until the VCO circuit is in operation, $T_{d2}$ is the starting time of the VCO circuit, $T_{d3}$ is the operating time of the aging monitor circuit, $f_{PLL}$ is the reference frequency signal output by PLL circuit, Measure is an enable signal of the aging monitor circuit, and start is an enable signal of the counter.

In accordance with the circuit aging monitoring theory, monitoring circuit performance degradation obtained from frequency degradation is denoted as $\Delta d(v)$, and is shown as Formula (1):

$$\Delta d(v) = \alpha \times \frac{f_{VCO} - f_{VCO0}}{f_{VCO0}} \times P_0 \qquad (1)$$

$\alpha=1$ is a coefficient, $P_0$ is primary circuit performance, $f_{VCO0}$ is primary frequency of the clock frequency signal output by VCO circuit in the primary state, and $f_{VCO}$ is aging frequency of the monitoring frequency signal output by VCO circuit in the aging state; in different aging environment, there are different frequency variable quantity $\Delta f = f_{VCO} - f_{VCO0}$; in such a circumstance, the worst aging coefficient variation is employed to calculate the circuit performance degradation.

Figure 15:
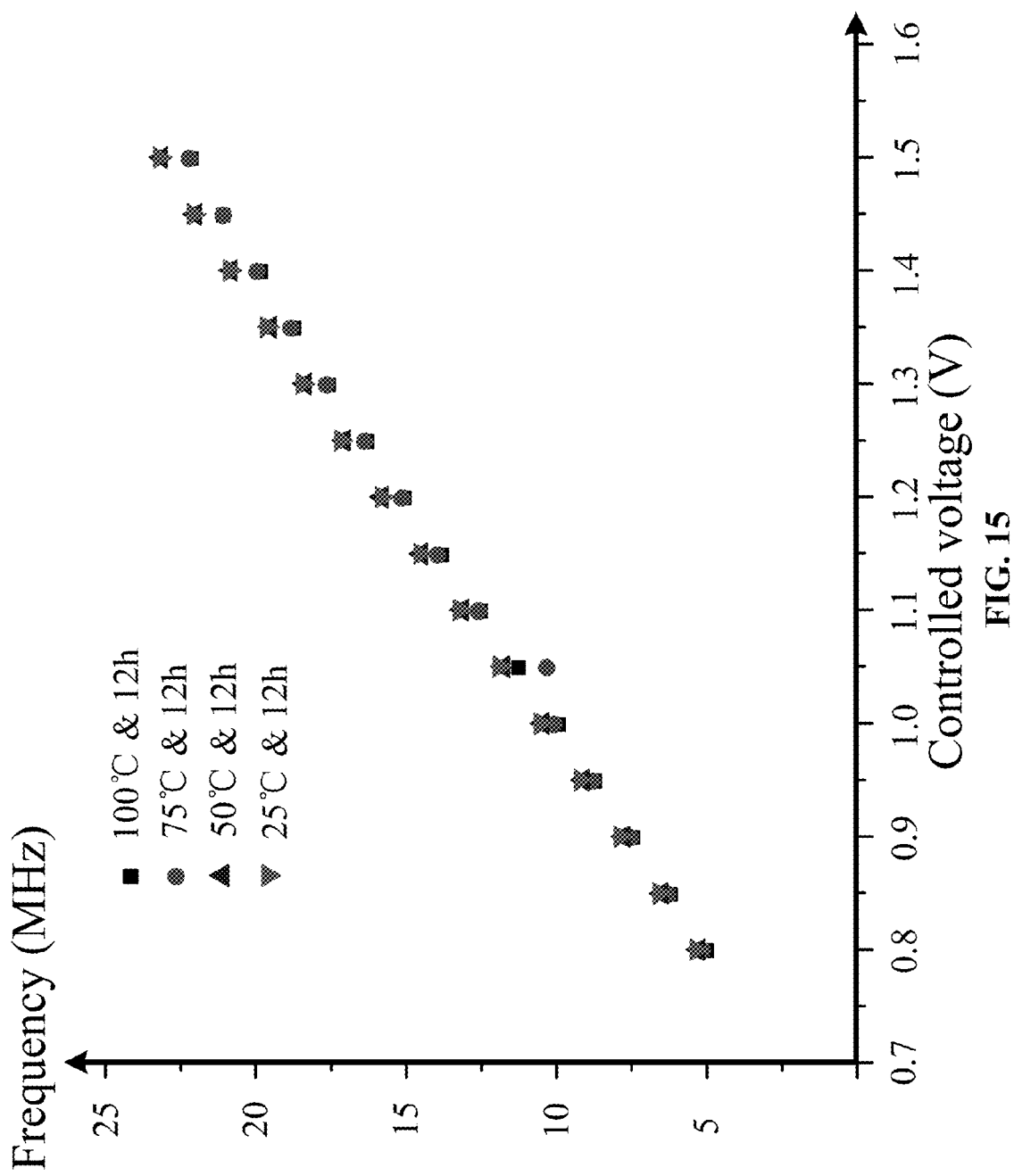
FIG. 15 is a change curve of aging data (output frequency) output when a high-accuracy PLL-VCO based aging monitor circuit is under high temperature.
Figure 16:
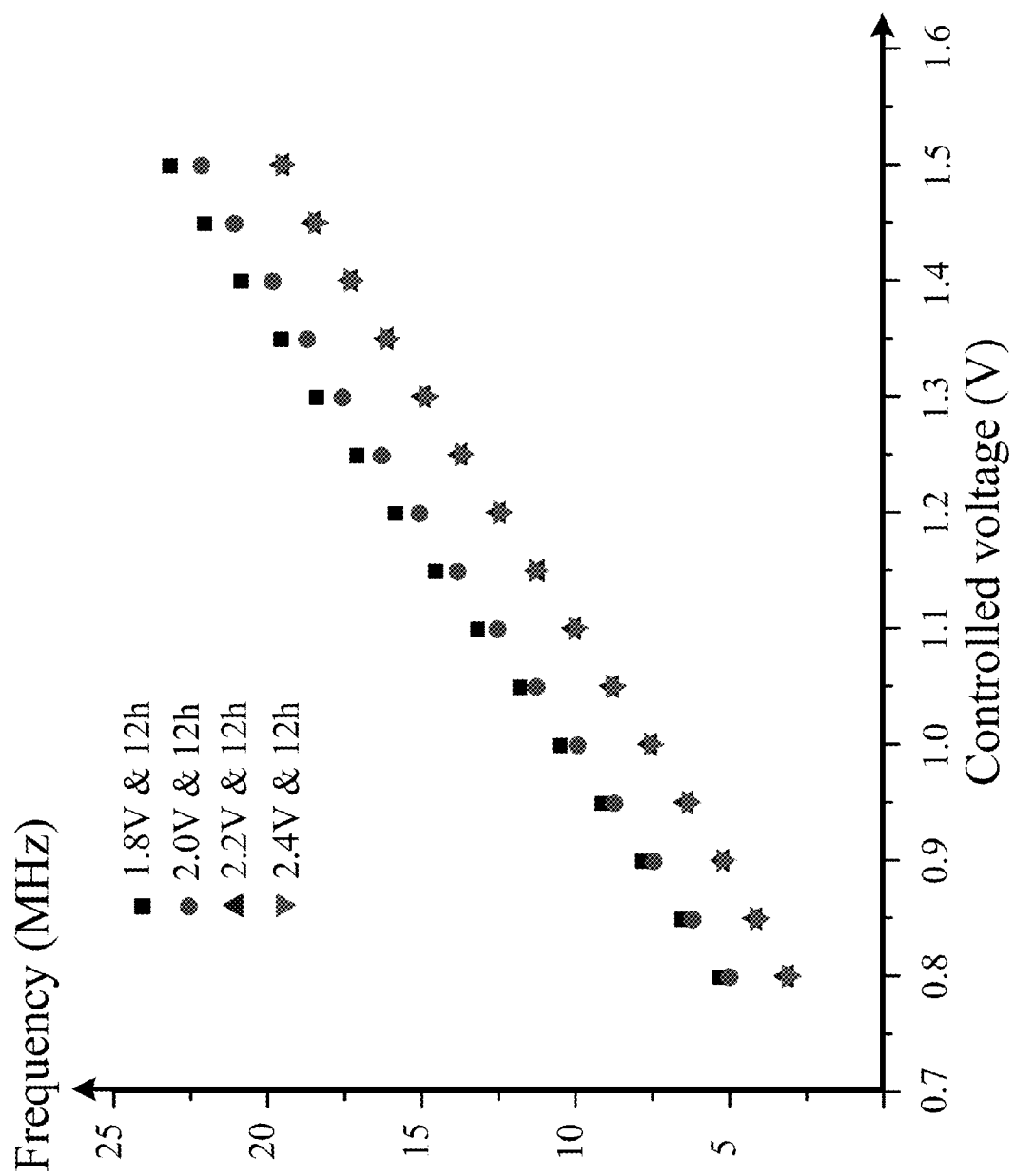
FIG. 16 is a change curve of aging data (output frequency) output when a high-accuracy PLL-VCO based aging monitor circuit is under high pressure.

High temperature can significantly affect circuit aging, as high temperature tends to destroy Si—H bond and so as to improve concentration of cavity inside a channel. The power voltage of the high-accuracy PLL-VCO based aging monitor circuit ranges from 0.8 V to 1.5 V, 50 mV a step, and primary output frequency of VCO circuit at normal temperature and pressure (1.2 V &27° C.) changes from 4.98 MHz to 23.15 MHz. In an incubator, a circuit is tested under 25° C., 50° C., 75° C. and 100° C., respectively, and after 12 hours of aging the aging data (output frequency) output by the circuit is shown as FIG. 15 by a change curve. High pressure can also significantly affect circuit aging. In a higher drain-source bias voltage, transverse field tends to increase gradually from the source to the drain and reach the highest field around the drain node. As the high filed exists, diffusion velocity of carriers in the cavity largely increases from carriers under high temperature. Therefore, high pressure accelerates circuit aging. The power voltage of the high-accuracy PLL-VCO based aging monitor circuit ranges from 0.8 V to 1.5 V, 50 mV a step, and primary output frequency of VCO circuit at normal temperature and pressure (1.2 V &27° C.) changes from 4.98 MHz to 23.15 MHz. By changing the power voltage, a circuit is tested under 1.8 V, 2.0 V, 2.2 V, and 2.4 V, respectively, and after 12 hours of aging the aging data (output frequency) output by the circuit is shown as FIG. 16 by a change curve.

Result of the aging test under high temperature shows that, performance of the high-accuracy PLL-VCO based aging monitor circuit after 12 hours of aging degraded about 2.4%; result of the aging test under high pressure shows that, performance of the high-accuracy PLL-VCO based aging monitor circuit after 12 hours of aging degraded about 18.7%. Therefore, performance degradation of the testing chip is: $2.4\% \times P_0$ aging degradation under high temperature, and $18.7\% \times P_0$ aging degradation under high pressure, respectively. Results in comparison with other literatures are shown by Table 1.

TABLE 1

Comparison of aging data with related literatures

| Related literatures | Monitor | Craft | Structural block diagram | Type | Self aging |
|---|---|---|---|---|---|
| IEEE International Solid-State Circuits Conference Digest of Technical Papers 2002 | An oscillator and a counter | 150 nm | 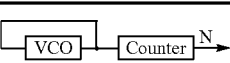 | Digital | Yes |
| IEEE Transactions on Circuits and Systems-II: Express Briefs 2010 | Two oscillators and two counters | 45 nm | 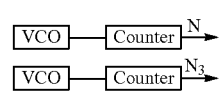 | Digital | Yes |
| IEEE Journal of Solid-State Circuits 2008 | Silicon odometer | 65 nm | 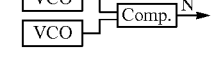 | Digital | Yes |
| IEEE Transactions on Very Large Scale Integration (VLSI) Systems 2010 | A phase locking loop | 130 nm | 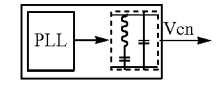 | Analog | Yes |
| IEEE Transactions on Circuits and Systems-I: Regular Papers 2011 | A PMOS transistor and a NMOS transistor | 65 nm |  | Analog | Yes |

TABLE 1-continued

Comparison of aging data with related literatures

| Related literatures | Monitor | Craft | Structural block diagram | Type | Self aging |
|---|---|---|---|---|---|
| The invention | PLL-VCO monitor | 65 nm | 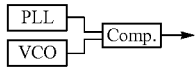 | Digital | No |

From Table 1, as the high-accuracy PLL-VCO based aging monitor circuit eliminates self-aging effect of the circuits, thus 18.7% accuracy is improved as seen from the testing results. In addition, the PLL-VCO based aging monitor circuit employs a structure of frequency difference testing circuit, and is capable to output in an all-digital mode, so the aging monitor is easier to control than analogs of former literatures.

The high-accuracy PLL-VCO based aging monitor circuit has an advantage that: a reference frequency signal output by the PLL circuit is only affected by an external reference clock signal, so that effects of self-aging of the aging monitor is eliminated. In addition, the high-accuracy PLL-VCO based aging monitor circuit, realized by CMOS craft of TSMC 65 nm, is tested aging condition under high temperature and high pressure, respectively, and the results show that the aging monitor circuit can improve 2.4% and 18.7% of accuracy respectively.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A PLL-VCO based integrated circuit aging monitor, comprising:
   a) a control circuit;
   b) a monitoring circuit, the monitoring circuit comprising: a reference circuit, an aging generation circuit and a comparison circuit, wherein, the reference circuit is a phase locking loop (PLL) circuit which is insensitive to a parameter error caused by aging of a circuit; the aging generation circuit is a voltage controlled oscillator (VCO) circuit which is sensitive to the parameter error caused by the aging of the circuit; and
   c) an output circuit;
   wherein
   the control circuit is connected to the PLL circuit, the VCO circuit, the comparison circuit, and the output circuit; an output end of the PLL circuit is connected to a first input end of the comparison circuit, and an output end of the VCO circuit is connected to a second input end of the comparison circuit, and an output end of the comparison circuit is connected to an input end of the output circuit;
   an input end of the PLL circuit inputs a reference clock signal; the output end of the PLL circuit outputs a reference frequency signal, and the output end of the VCO circuit outputs a monitoring frequency signal; and
   when in use, the comparison circuit compares the reference frequency signal with the monitoring frequency signal to yield aging data and then outputs the aging data via an output end of the output circuit; an amplitude of the reference clock signal is the same as that of a clock frequency signal output by the VCO circuit in an initial state; a period of the clock frequency signal output by the VCO circuit in the initial state is denoted as T, and the period of the reference clock signal is T1, and T≤T1≤2T.

2. The integrated circuit aging monitor of claim 1, wherein
   the VCO circuit comprises at least one VCO unit, and the at least one VCO unit comprises: a differential voltage oscillator, a first level shifter and a second level shifter having the same circuit structure, a duty cycle circuit, and a first frequency divider;
   a control end of the differential voltage oscillator is connected to a controller; a first output end of the differential voltage oscillator is connected to an input end of the first level shifter; a second output end of the differential voltage oscillator is connected to an input end of the second level shifter; an output end of the first level shifter is connected to a first input end of the duty cycle circuit; an output end of the second level shifter is connected to a second input end of the duty cycle circuit; an output end of the duty cycle circuit is connected to an input end of the first frequency divider; an output end of the first frequency divider is an output end of the VCO unit, and one output end of the VCO unit functions one output end of the VCO circuit.

3. The integrated circuit aging monitor of claim 2, wherein
   the first level shifter and the second level shifter each comprise: a first PMOS transistor; a second PMOS transistor; a first NMOS transistor; a second NMOS transistor; and an inverter; sources of the first PMOS transistor and the second PMOS transistor both are connected to a power supply; a drain of first PMOS transistor, a drain of first NMOS transistor and a gate of the second PMOS transistor are connected together; a gate of the first PMOS transistor, a drain of second PMOS transistor and a drain of second NMOS transistor are connected together, and a connection end thereof is the output end of the level shifters; a gate of the first NMOS transistor is connected to an input end of the inverter, and a connection end thereof is the input end of the first and second level shifters; an output end of the inverter is connected to a gate of the second NMOS transistor; and sources of the first NMOS transistor and the second NMOS transistor are both grounded;
   the duty cycle circuit comprises: a third PMOS transistor; a fourth PMOS transistor; a third NMOS transistor; and a fourth NMOS transistor; a gate of the third NMOS transistor is connected to a gate of the fourth PMOS transistor and a connection end thereof is the first output end of the duty cycle circuit; a gate of the fourth NMOS transistor is connected to a gate of the third PMOS transistor, and a connection end thereof is the second output end of the duty cycle circuit; a drain of third NMOS transistor and a source of the third PMOS transistor both connect to the power supply; a source of the third NMOS transistor, a drain of third PMOS transistor, a drain of fourth NMOS transistor and a source of the fourth PMOS transistor are connected together and a connection end thereof is the output end of the duty cycle circuit; a source of the fourth NMOS transistor and a drain of fourth PMOS transistor are both grounded;

the differential voltage oscillator comprises: a first NAND gate; a second NAND gate; and n cascaded differential delay cells which have the same circuit structures, and n is an odd number greater than 1; the differential delay cells each comprise: a fifth PMOS transistor, a sixth PMOS transistor, a fifth NMOS transistor and a sixth NMOS transistor; and sources of the fifth PMOS transistor and the sixth PMOS transistor both connect to the power supply; a drain of the fifth PMOS transistor and a gate of the sixth PMOS transistor and a drain of the fifth NMOS transistor are connected together and a connection end thereof is the second output end of the differential delay cells; a drain of the sixth PMOS transistor, a gate of the fifth PMOS transistor and a drain of the sixth NMOS transistor are connected together, and a connection end thereof is a first output end of the differential delay cells; sources of the fifth NMOS transistor and the sixth NMOS transistor are both grounded; a gate of the fifth NMOS transistor is a first input end of the differential delay cells, and a gate of the sixth NMOS transistor is a second input end of the differential delay cells; a first input end of the first NAND gate is connected to a first input end of the second NAND gate, and a connection end thereof is the control end of the differential voltage oscillator; an output end of the first NAND gate is connected to a first input end of a 1st differential delay cell; an output end of the second NAND gate is connected to a second input end of the 1st differential delay cell; a first output end of a jth differential delay cell is connected to a first input end of a (j+1)th differential delay cell; a second output end of the jth differential delay cell is connected to a second input end of the (j+1)th differential delay cell, j=1, 2, 3, . . . , n−1; a first output end of a nth differential delay cell is connected to a second output end of the first NAND gate; a second output end of the nth differential delay cell is connected to a second input end of the second NAND gate, and a first output end of the nth differential delay cell is a first output end of the differential voltage oscillator; and a second output end of the nth differential delay cell is a second output end of the differential voltage oscillator.

4. The integrated circuit aging monitor of claim 1, wherein the PLL circuit comprises: a third NAND gate; a phase frequency detector; a charge pump; a low-pass filter; a voltage controlled oscillator (VCO); and a second frequency divider; and a first input end of the third NAND gate is the input end of the PLL circuit; a second input end of the third NAND gate is the control end of the PLL circuit and is connected to a controller; an output end of the third NAND gate is connected to a first input end of the phase frequency detector; an output end of the phase frequency detector is connected to an input end of the charge pump; an output end of the charge pump is connected to an input end of the low-pass filter; an output end of the low-pass filter is connected to the voltage control end of the VCO; an output end of the VCO is connected to the input end of the second frequency divider; an output end of the second frequency divider is connected to a second input end of the phase frequency detector, and an output end of the phase frequency detector is the output end of the PLL circuit.

5. The integrated circuit aging monitor of claim 4, wherein the VCO comprises m cascaded voltage controlled oscillating units, and m is an odd number greater than 1;

the voltage controlled oscillating units each comprise: a seventh PMOS transistor; an eighth PMOS transistor; a seventh NMOS transistor; and an eighth NMOS transistor;

a source of the seventh PMOS transistor is connected to a source of the eighth PMOS transistor, and a connection end thereof is the voltage control end of the voltage controlled oscillating units; a gate of the seventh NMOS transistor is a first input end of the voltage controlled oscillating units, and a gate of the eighth NMOS transistor is a second input end of the voltage controlled oscillating units; a drain of seventh PMOS transistor, a gate of the eighth PMOS transistor and a drain of seventh NMOS transistor are connected together, and a connection end thereof is a second output end of the voltage controlled oscillating units; a drain of eighth PMOS transistor, a gate of the seventh PMOS transistor and a drain of eighth NMOS transistor are connected together, and a connection end thereof is a first output end of the voltage controlled oscillating units; sources of the seventh NMOS transistor and the eighth NMOS transistor are both grounded;

a first output end of a kth voltage controlled oscillating unit is connected to a first input end of a (k+1)th voltage controlled oscillating unit; a second output end of the kth voltage controlled oscillating unit is connected to a second input end of the (k+1)th voltage controlled oscillating unit, and k=1, 2, 3, . . . , m−1; a first output end of an mth voltage controlled oscillating unit is connected to a first input end of a 1st voltage controlled oscillating unit; a second output end of the mth voltage controlled oscillating unit is connected to a second input end of the 1st voltage controlled oscillating unit; a first output end of the mth voltage controlled oscillating unit is the output end of the VCO; the voltage control end of the mth voltage controlled oscillating unit is in connection, and a connection end thereof is the voltage control end of the VCO.

6. The integrated circuit aging monitor of claim 1, wherein the comparison circuit comprises: a phase comparator; and a counter;

the output circuit is a shift register; and the output end of the PLL circuit is connected to a first input end of the phase comparator and a first input end of the counter; a second output end of the phase comparator is connected to the output end of the VCO circuit; an output end of the phase comparator is connected to a second output end of the counter; a control end of the counter is connected to a control circuit; an output end of the counter is connected to an input end of the shift register; and an output end of the shift register outputs the aging data.

\* \* \* \* \*